US012685108B2

(12) United States Patent
Sherwood et al.

(10) Patent No.: US 12,685,108 B2
(45) Date of Patent: Jul. 14, 2026

(54) METHOD TO IMPROVE INTERCONNECT COEFFICIENT OF THERMAL EXPANSION

(71) Applicant: Applied Materials, Inc., Santa Clara, CA (US)

(72) Inventors: Tyler Sherwood, Fonda, NY (US); Raghav Sreenivasan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 510 days.

(21) Appl. No.: 18/186,656

(22) Filed: Mar. 20, 2023

(65) Prior Publication Data

US 2024/0321636 A1 Sep. 26, 2024

(51) Int. Cl.
| | |
|---|---|
| *H10W 20/00* | (2026.01) |
| *H10P 70/00* | (2026.01) |
| *H10P 72/00* | (2026.01) |
| *H10W 20/41* | (2026.01) |
| *H10W 20/44* | (2026.01) |
| *H10W 40/25* | (2026.01) |

(52) U.S. Cl.
CPC ....... *H10W 20/056* (2026.01); *H10W 20/062* (2026.01); *H10W 20/4424* (2026.01); *H10W 40/258* (2026.01); *H10P 70/27* (2026.01);

*H10P 72/0452* (2026.01); *H10P 72/0468* (2026.01); *H10W 20/033* (2026.01); *H10W 20/081* (2026.01); *H10W 20/425* (2026.01)

(58) Field of Classification Search
None
See application file for complete search history.

(56) References Cited

U.S. PATENT DOCUMENTS

| | | | | |
|---|---|---|---|---|
| 6,022,808 A | * | 2/2000 | Nogami | ............ H01L 23/53233 257/E21.585 |
| 2007/0292604 A1 | * | 12/2007 | Dordi | ................ H01L 21/67161 427/532 |

* cited by examiner

*Primary Examiner* — Alexander G Ghyka
(74) *Attorney, Agent, or Firm* — Kilpatrick Townsend & Stockton LLP

(57) ABSTRACT

The present technology includes semiconductor processing methods and devices with improved expansion of the bulk material in substrate features. Methods include cleaning a substrate that is formed from silicon oxide and that defines one or more features and that includes a liner that extends across the silicon oxide and within one or more features and a copper-containing layer deposited on the liner and extending within the one or more features. Methods include depositing a second metal over the substrate, where the second metal has a coefficient of thermal expansion of greater than or about 17. Methods also include diffusing the second metal into the copper containing layer to form a copper alloy.

15 Claims, 4 Drawing Sheets

300

METHOD TO IMPROVE INTERCONNECT COEFFICIENT OF THERMAL EXPANSION

TECHNICAL FIELD

The present technology relates to semiconductor processes and devices. More specifically, the present technology relates to fabrication of integrated circuits in semiconductor structures and the devices formed.

BACKGROUND

Integrated circuits are made possible by processes which produce intricately patterned material layers on substrate surfaces. Producing patterned material on a substrate requires controlled methods for deposition, expansion, and removal of materials. However, with new device designs, producing high quality layers of material may be challenging, particularly with ever-shrinking interconnect regions necessary for hybrid bonding.

Thus, there is a need for improved systems and methods that can be used to produce high quality devices and structures. These and other needs are addressed by the present technology.

BRIEF SUMMARY

Embodiments of the present technology include semiconductor processing methods with improved expansion of the bulk material in substrate features. Methods include cleaning a substrate that is formed from silicon oxide and defines one or more features and having a liner that extends across the silicon oxide and within one or more features, and a copper-containing layer deposited on the liner and extending within the one or more features. Methods include depositing a second metal over the substrate, where the second metal has a coefficient of thermal expansion of greater than or about 17. Methods also include diffusing the second metal into the copper containing layer to form a copper alloy.

In embodiments, the copper-containing layer is deposited in one or more features having a height to width aspect ratio of greater than or about 6:1. In more embodiments, the substrate includes an organic film, or the liner is or includes an organic film. Moreover, in embodiments, the diffusion step includes an anneal process at a temperature of less than or about 350° C. In more embodiments, the copper-alloy has a coefficient of thermal expansion that is at least about 20% greater than a coefficient of thermal expansion of copper. Additionally or alternatively, in embodiments, the coefficient of thermal expansion of the copper-alloy is at least about 40% greater than the coefficient of thermal expansion of copper. In more embodiments, the second metal is tin, aluminum, nickel, lead, zinc, or a combination thereof.

Method embodiments also include a further step of polishing the substrate after forming the copper-alloy. In embodiments, a cleaning step includes a deoxidation treatment. In more embodiments, the cleaning is an in-situ cleaning module. Moreover, in embodiments, methods include transferring the substrate under vacuum from the in-situ cleaning module to a deposition chamber configured to deposit the second metal. In more embodiments, the deposition chamber is a chemical vapor deposition chamber, a physical vapor deposition chamber, an atomic layer deposition chamber, a thermally enhanced chemical vapor deposition chamber, a plasma-enhanced chemical vapor deposition chamber, an electroless deposition chamber, or a plasma enhanced atomic layer deposition chamber.

Embodiments of the present technology also include semiconductor processing methods. Methods include etching one or more features having a first side, a second side, a bottom, and a height to width aspect ratio of greater than or about 6:1 in a substrate that includes silicon oxide. Methods include forming a liner extending across the silicon oxide and within the one or more features. Methods include depositing a copper-containing layer on the liner and extending within the one or more features. Methods include deoxidizing the copper-containing layer and depositing a second metal over the deoxidized copper-containing layer, where the second metal has a coefficient of thermal expansion of greater than or about 17. Methods also include annealing the second metal into the copper containing layer to form a copper-alloy that extrudes at least to a plane of the substrate or liner. In embodiments, methods include where the copper alloy extrudes greater than or about 1 nm at an annealing temperature of less than or about 350° C.

Embodiments of the present technology also include semiconductor devices. Devices include a silicon oxide substrate that defines two or more features, each having a first side, second side, and a bottom. In devices, a liner extends across the silicon oxide and within the one or more features, and a copper-alloy layer deposited on the liner and extending within the one or more features. In devices, the copper-alloy layer has a coefficient of thermal expansion of greater than or about 17. Devices include where each feature has a height to width aspect ratio of greater than or about 6:1.

In embodiments, the copper-alloy layer contains at least about 60 wt. % copper based upon the weight of the copper-alloy layer. In more embodiments, the copper-alloy has a lower portion adjacent to the bottom of the respective feature and an upper portion disposed adjacent to an upper surface of the substrate, where the lower portion contains a higher percentage of copper in the copper-alloy than the upper portion. In embodiments, the coefficient of thermal expansion of the copper-alloy is greater than or about 20. In more embodiments, devices can further include an organic film, or the liner includes an organic film.

Such technology may provide numerous benefits over conventional systems and techniques. For example, the processes may produce devices with improved interconnect height even in small aspect ratio trenches. Additionally, the processes may increase the coefficient of thermal expansion of a copper containing layer, that may allow lower post bond anneal temperatures to be utilized. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
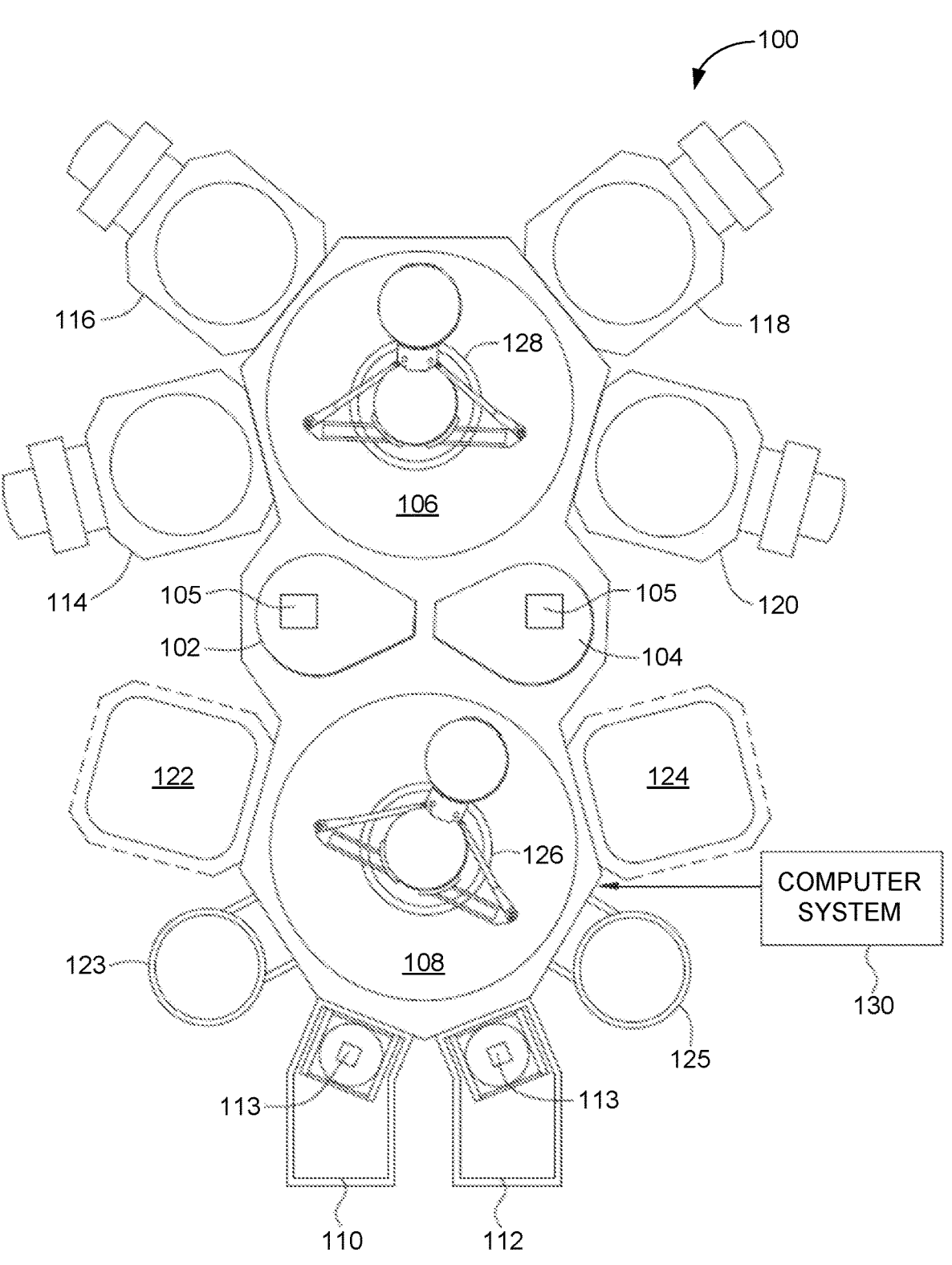
FIG. 1 shows a top plan view of one embodiment of an exemplary processing system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Microelectronic devices, such as micro-scale electronic, electro-mechanical or optical devices are generally fabricated on and/or in work pieces or substrates, such as silicon wafers. In a typical fabrication process, for example on a semiconductor material wafer, a conductive seed layer is first applied onto the surface of the substrate using chemical vapor deposition (CVD), physical vapor deposition (PVD), electroless plating processes, or other suitable methods. After forming the seed layer, a layer of metal is plated onto the substrate by applying an appropriate electrical potential between the seed layer and one or more electrodes in the presence of an electro-processing solution containing metal ions. The substrate is then cleaned and/or annealed in subsequent procedures to form devices, contacts or conductive lines. Some substrates may have a barrier layer with the seed layer formed on the barrier layer.

Currently, most microelectronic devices are made on substrates plated with copper (Cu). Using known techniques, features on the substrate are filled with electroplated copper using acidic copper electroplating solutions. These electroplating solutions often use additives to promote a super-conformal fill process (with the features filling primarily from the bottom up, rather than inwardly from the sides) to create a void-free fill. As the feature sizes shrink, achieving void-free fill with the traditional copper plating processes has become more difficult. In addition, although copper has high conductivity, it typically involves a barrier layer such as tantalum nitride (TaN) to prevent diffusion of copper into the substrate or dielectric material on the substrate. However, conventional barrier layers, such as tantalum nitride barrier layers have relatively low conductivity. In addition, as the features get narrower (e.g. high height to width aspect ratio), the barrier layer used for copper occupies a larger relative volume of the narrow feature, because a minimum barrier layer thickness is typically necessary to prevent copper diffusion, regardless of feature size.

Attempts have been made to utilize organic films as barrier layers. However, copper interconnects require a high anneal temperature, such as greater than $350°$ C., in order to properly extrude throughout the feature. Namely, copper exhibits a low coefficient of thermal expansion (about 16 CTE). Thus, as coefficients of thermal expansion are based upon both volume and temperature, a high temperature is necessary to achieve the expansion necessary for a robust bulk interconnect, particularly at shrinking interconnect volumes. As may be apparent, this phenomenon may be particularly noticeable as required pitch values continue to decrease. Specifically, in addition to having a low coefficient of thermal expansion, copper has a low aspect ratio limit during electroplating, and must be deposited at aspect ratios of 7:1 or less. Therefore, as maximum pitch values shrink, the overall feature height must also shrink to maintain the necessary aspect ratio. This leads to problems, as the interconnect then lacks sufficient bulk copper to allow adequate extrusion of the copper to the top of the interconnect. Efforts have been made to increase aspect ratio limits by filling features utilizing metal alloys. However, surprisingly, copper-metal alloys exhibited even lower aspect ratio limits when filled according to conventional techniques, such as less than 5:1 or even less than 3:1.

The present technology overcomes these, and other issues associated with conventional semiconductor devices by providing processes and devices that exhibit increased coefficients of thermal expansion of one or more copper-containing layers. Namely, the present technology has surprisingly found that by diffusing one or more non-copper metals into a pre-filled copper-containing layer, a coefficient of thermal expansion of the copper-containing layer can be drastically increased without sacrificing conductivity of the interconnect. In addition, in embodiments, such improved expansion can occur without decreasing the aspect ratio limits of the pre-filled copper and/or allow for improved extrusion at smaller feature heights. Such an alloy in the copper-containing layer allows for increased expansion in the (now) copper-alloy containing layer at lower temperatures, or when present in devices having a small pitch, small height, high aspect ratio or a combination thereof, which provides greater bulk copper-containing material in the interconnect and allows for pitch scaling not previously achievable with copper alone. Furthermore, methods and substrates discussed herein are also compatible with organic films, as, in embodiments, increased copper-alloy containing layer volume can be obtained at temperatures that do not destroy or denature organic films due to the increase in coefficient of thermal expansion of the copper-alloy containing material.

Although the remaining disclosure will routinely identify specific deposition processes in methods and semiconductor devices of the disclosed technology, it will be readily understood that the devices and methods are equally applicable to a variety of other semiconductor processes and devices. Accordingly, the technology should not be considered to be so limited as for use with the described deposition methods and resulting devices alone. The disclosure will discuss one possible method that can be used with the present technology before describing methods or operations of exemplary process sequences according to some embodiments of the present technology. It is to be understood that the technology is not limited to the equipment described, and processes discussed may be performed in any number of processing chambers and systems, along with any number of modifications.

FIG. 1 illustrates a top plan view of a multi-chamber processing system 100, which may be specifically configured to implement aspects or operations according to some embodiments of the present technology. The multi-chamber processing system 100 may be configured to perform one or more fabrication processes on individual substrates, such as any number of semiconductor substrates, for forming semiconductor devices. The multi-chamber processing system 100 may include some or all of a transfer chamber 106, a buffer chamber 108, single wafer load locks 110 and 112, although dual load locks may also be included, processing chambers 114, 116, 118, 120, 122, and 124, preheating chambers 123 and 125, and robots 126 and 128. The single wafer load locks 110 and 112 may include heating elements 113 and may be attached to the buffer chamber 108. The processing chambers 114, 116, 118, and 120 may be attached to the transfer chamber 106. The processing chambers 122 and 124 may be attached to the buffer chamber 108. Two substrate transfer platforms 102 and 104 may be disposed between transfer chamber 106 and buffer chamber 108, and may facilitate transfer between robots 126 and 128. The platforms 102, 104 can be open to the transfer chamber and buffer chamber, or the platforms may be selectively isolated or sealed from the chamber to allow different operational pressures to be maintained between the transfer chamber 106 and the buffer chamber 108. Transfer platforms 102 and 104 may each include one or more tools 105, such as for orientation or measurement operations.

The operation of the multi-chamber processing system 100 may be controlled by a computer system 130. The computer system 130 may include any device or combination of devices configured to implement the operations described below. Accordingly, the computer system 130 may be a controller or array of controllers and/or a general purpose computer configured with software stored on a non-transitory, computer-readable medium that, when executed, may perform the operations described in relation to methods according to embodiments of the present technology. Each of the processing chambers 114, 116, 118, 120, 122, and 124 may be configured to perform one or more process steps in the fabrication of a semiconductor structure. More specifically, the processing chambers 114, 116, 118, 120, 122, and 124 may be outfitted to perform a number of substrate processing operations including dry etch processes, cyclical layer deposition, atomic layer deposition, chemical vapor deposition, physical vapor deposition, etch, pre-clean, degas, orientation, among any number of other substrate processes.

Figure 2:
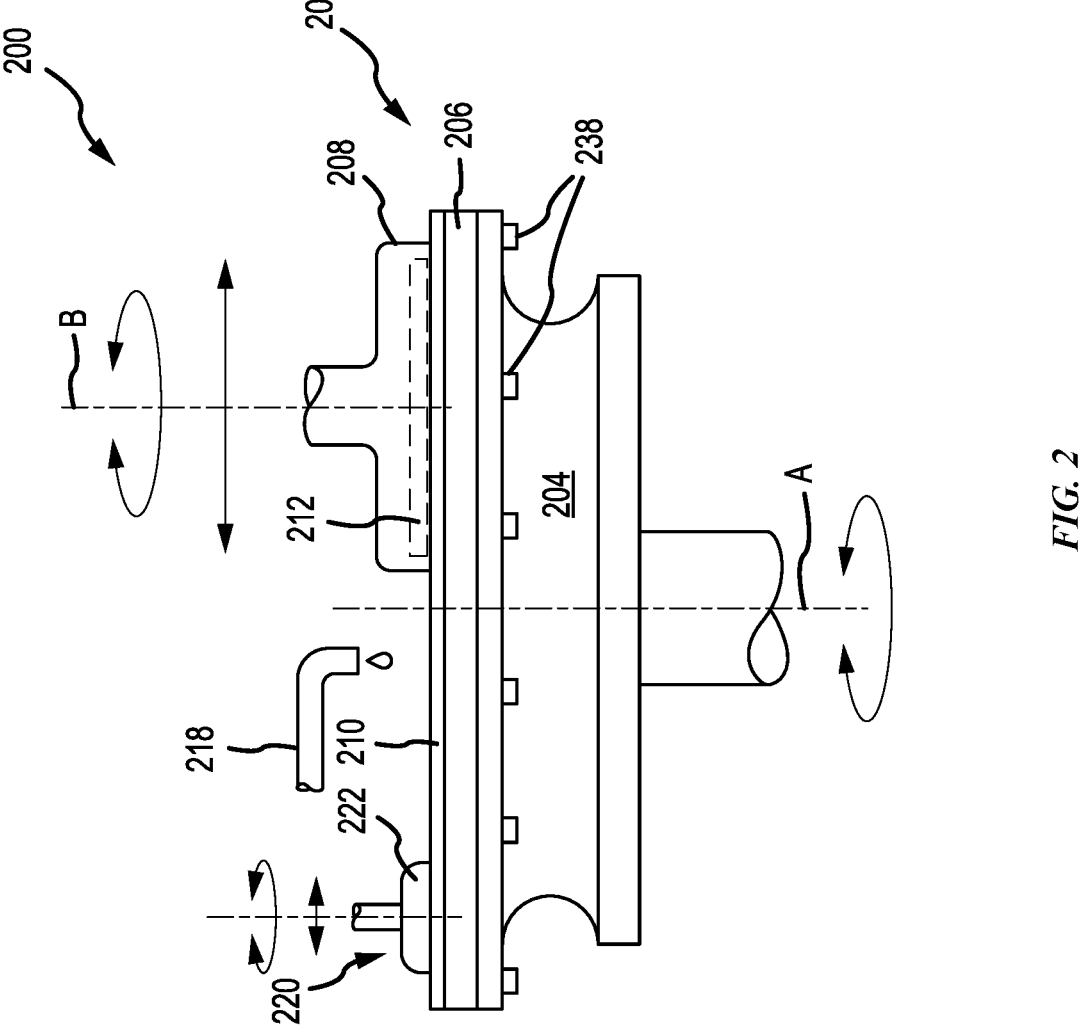
FIG. 2 shows a schematic cross-sectional view of an exemplary processing system according to some embodiments of the present technology.

FIG. 2 shows a schematic cross-sectional view of an exemplary polishing system 200 that may be disposed in one or more process chambers 114, 116, 118, 120, 122, and/or 124 according to some embodiments of the present technology. Polishing system 200 includes a platen assembly 202, which includes a lower platen 204 and an upper platen 206. Lower platen 204 may define an interior volume or cavity through which connections can be made, as well as in which may be included end-point detection equipment or other sensors or devices, such as eddy current sensors, optical sensors, or other components for monitoring polishing operations or components. For example, and as described further below, fluid couplings may be formed with lines extending through the lower platen 204, and which may access upper platen 206 through a backside of the upper platen. Platen assembly 202 may include a polishing pad 210 mounted on a first surface of the upper platen. A substrate carrier 208, or carrier head, may be disposed above the polishing pad 210 and may face the polishing pad 210. The platen assembly 202 may be rotatable about an axis A, while the substrate carrier 208 may be rotatable about an axis B. The substrate carrier may also be configured to sweep back and forth from an inner radius to an outer radius along the platen assembly, which may, in part, reduce uneven wear of the surface of the polishing pad 210. The polishing system 200 may also include a fluid delivery arm 218 positioned above the polishing pad 210, and which may be used to deliver polishing fluids, such as a polishing slurry, onto the polishing pad 210. Additionally, a pad conditioning assembly 220 may be disposed above the polishing pad 210 and may face the polishing pad 210.

In some embodiments of performing a chemical-mechanical polishing process, the rotating and/or sweeping substrate carrier 208 may exert a downforce against a substrate 212, which is shown in phantom and may be disposed within or coupled with the substrate carrier. The downward force applied may depress a material surface of the substrate 212 against the polishing pad 210 as the polishing pad 210 rotates about a central axis of the platen assembly. The interaction of the substrate 212 against the polishing pad 210 may occur in the presence of one or more polishing fluids delivered by the fluid delivery arm 218. A typical polishing fluid may include a slurry formed of an aqueous solution in which abrasive particles may be suspended. Often, the polishing fluid contains a pH adjuster and other chemically active components, such as an oxidizing agent, which may enable chemical mechanical polishing of the material surface of the substrate 212.

The pad conditioning assembly 220 may be operated to apply a fixed abrasive conditioning disk 222 against the surface of the polishing pad 210, which may be rotated as previously noted. The conditioning disk may be operated against the pad prior to, subsequent, or during polishing of the substrate 212. Conditioning the polishing pad 210 with the conditioning disk 222 may maintain the polishing pad 210 in a desired condition by abrading, rejuvenating, and removing polish byproducts and other debris from the polishing surface of the polishing pad 210. Upper platen 206 may be disposed on a mounting surface of the lower platen 204, and may be coupled with the lower platen 204 using a plurality of fasteners 238, such as extending through an annular flange shaped portion of the lower platen 204.

The polishing platen assembly 202, and thus the upper platen 206, may be suitably sized for any desired polishing system, and may be sized for a substrate of any diameter, including 200 mm, 300 mm, 450 mm, or greater. For example, a polishing platen assembly configured to polish 300 mm diameter substrates, may be characterized by a diameter of more than about 300 mm, such as between about 500 mm and about 1000 mm, or more than about 500 mm. The platen may be adjusted in diameter to accommodate substrates characterized by a larger or smaller diameter, or for a polishing platen 206 sized for concurrent polishing of multiple substrates. The upper platen 206 may be characterized by a thickness of between about 20 mm and about 150 mm, and may be characterized by a thickness of less than or about 100 mm, such as less than or about 80 mm, less than or about 60 mm, less than or about 40 mm, or less. In some embodiments, a ratio of a diameter to a thickness of the polishing platen 206 may be greater than or about 3:1, greater than or about 5:1, greater than or about 10:1, greater than or about 15:1, greater than or about 20:1, greater than or about 25:1, greater than or about 30:1, greater than or about 40:1, greater than or about 50:1, or more.

The upper platen and/or the lower platen may be formed of a suitably rigid, light-weight, and polishing fluid corrosion-resistant material, such as aluminum, an aluminum alloy, or stainless steel, although any number of materials may be used. Polishing pad 210 may be formed of any number of materials, including polymeric materials, such as polyurethane, a polycarbonate, fluoropolymers, polytetrafluoroethylene polyphenylene sulfide, or combinations of any of these or other materials. Additional materials may be or include open or closed cell foamed polymers, elastomers, felt, impregnated felt, plastics, or any other materials that may be compatible with the processing chemistries. It is to be understood that polishing system 200 is included to provide suitable reference to components discussed below, which may be incorporated in polishing system 200, although the description of polishing system 200 is not intended to limit the present technology in any way, as embodiments of the present technology may be incorporated in any number of polishing systems that may benefit from the components and/or capabilities as described further below.

Figure 3:
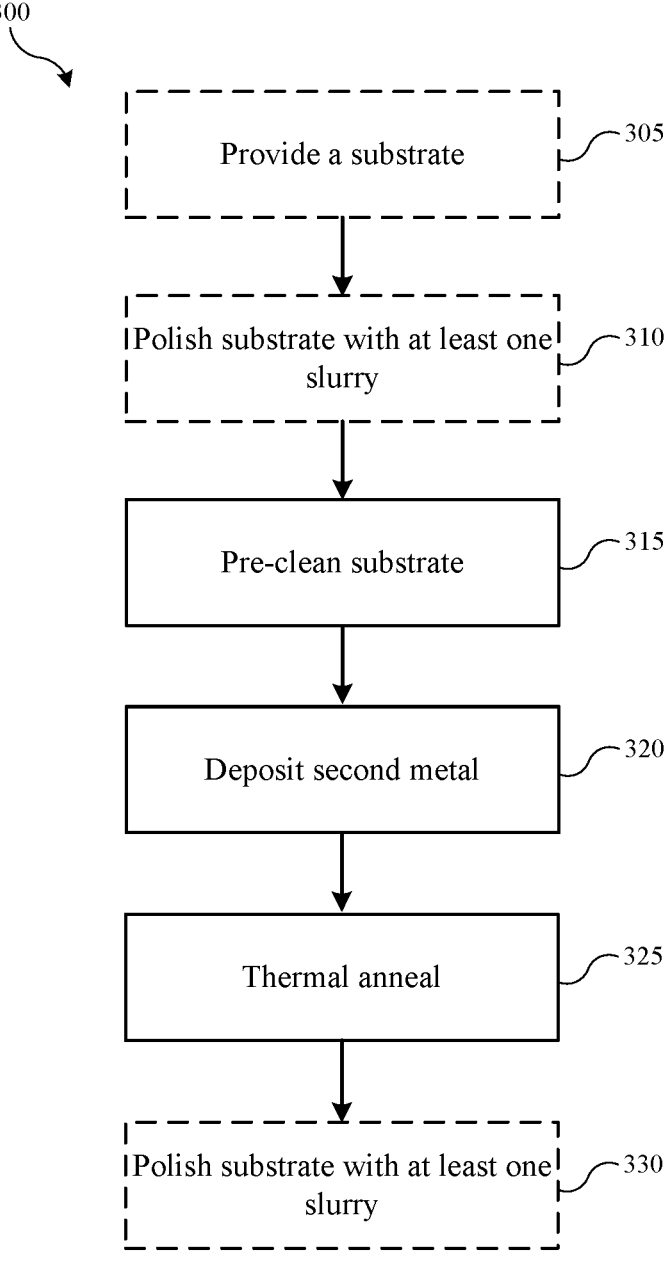
FIG. 3 shows exemplary operations in a method of forming semiconductor devices according to some embodiments of the present technology.

FIG. 3 shows exemplary operations in a method 300 according to some embodiments of the present technology. The method may be performed in a variety of processing systems, including processing system 100 described above. described above, as well as any processing chambers therein, in which the operations may be performed. Method 300 may include one or more operations prior to the initiation of the method 300, including front-end processing, deposition, etching, polishing, cleaning, or any other operations that may be performed prior to the described operations. The methods 300 may include a number of optional operations, which may or may not be specifically associated with some embodiments of methods according to embodiments of the present technology. Method 300 may describe operations shown schematically in FIGS. 4A-4E, the illustrations of which will be described in conjunction with the operations of method 300. It is to be understood that the figures illustrate only partial schematic views, and a substrate 405 may contain any number of additional materials and features having a variety of characteristics and aspects as illustrated in the figures.

Figure 4A:
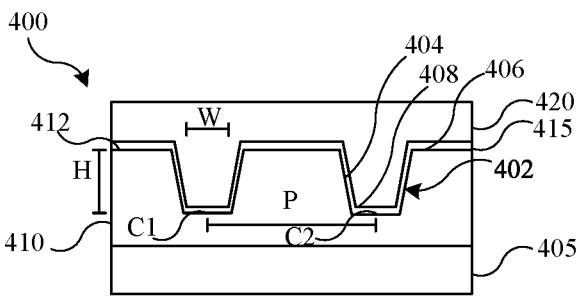
FIGS. 4A-4E show cross-sectional views of substrates being processed according to some embodiments of the present technology.

Method 300 may or may not involve optional operations to develop the semiconductor structure to a particular polishing operation, such as one or more semiconductor processing operations to develop one or more layers of material on a substrate, clamping a substrate to a carrier head of a polishing system 200, or depositing one or more metal layers in one or more features 402. It is to be understood that method 300 may be performed on any number of semiconductor structures or substrates 405, as illustrated in FIG. 4A, including exemplary structure 400 on which silicon oxide 410, liner 415, and copper-containing layer 420 may be formed. For instance, in embodiments, an operation 305 may include transferring a substrate 405 from a deposition chamber, such as process chamber 114, to a polishing chamber, such as process chamber 116 to provide a substrate having one or more copper-containing layers formed thereon.

Although the following description will regularly discuss silicon oxide, it is to be understood that any number of dielectric materials may be used in embodiments of the present technology, and the present technology should not be limited to any particular dielectric material in which features may be formed. As illustrated in FIG. 4A, the silicon oxide 410 may be processed to form one or more recesses or features 402, such as trenches, apertures or vias, or any other structure useful in semiconductor processing. Substrate 405 may be any number of materials, such as a base wafer or substrate 405 made of silicon or silicon-containing materials, or other substrate materials. For example, in some embodiments the substrate may be processed to include one or more materials or structures for semiconductor processing, such as the silicon oxide 410, liner 415, and one or more copper-containing layers 420. In embodiments, methods can include optional steps of etching one or more features 402 in an etching chamber and depositing a liner across the etched substrate 405 and in features 402. Although only two features 402 are shown in the figure, it is to be understood that exemplary structures may have any number of features defined along the structure according to embodiments of the present technology.

In embodiments, the one or more features 402 have a first side 404, second side 406, and bottom 408. Each feature 402 may have a height H extending from the bottom 408 of the respective feature, to an upper surface 412 of substrate 405. In addition, each feature 403 may have a bottom width W extending from a first side 404 to a second side 406 of each feature. Nonetheless, as discussed above, in embodiments, some or all of features 402 may be considered to have a high height H to width W aspect ratio, such as greater than or about 6:1, such as greater than or about 7:1, such as greater than or about 8:1, such as greater than or about 9:1, such as greater than or about 10:1, or any ranges or values therebetween. Namely, in embodiments, the methods and devices discussed herein may be capable of being utilized in features having aspect ratios well above the aspect ratio limit of pure copper or of copper-metal alloys filled in features as an alloy. However, it should be understood that, in embodiments, feature 402 discussed herein may have an aspect ratio of lower than 6:1, such as less than or about 5:1, such as less than or about 4:1, such as less than or about 3:1, such as less than or about 2:1, or any ranges or values therebetween, as the methods and devices discussed herein may allow for improved extrusion heights in features of all aspect ratios such as those having heights where extrusion would be unachievable utilizing copper alone, providing beneficial connections for heterogenous and hybrid bonding.

As may be understood from the above discussion, substrates according to the present technology may also advantageously exhibit smaller pitch values without sacrificing feature height and/or allow for improved extrusion at smaller feature heights. Thus, in embodiments, a substrate according to the present technology may have a pitch P, defined as the distance between a center point of a first feature C1 and a center point of a second feature C2, of about 50 μm or less, such as less than or about 45 μm, such as less than or about 40 μm, such as less than or about 35 μm, such as less than or about 30 μm, such as less than or about 25 μm, such as less than or about 20 μm, such as less than or about 15 μm, such as less than or about 10 μm, such as less than or about 5 μm, such as less than or about 2.5 μm, such as less than or about 1 μm, such as less than or about 750 nm, such as less than or about 500 nm, or any ranges or values therebetween.

Moreover, as previously discussed, the above pitch values may be obtained without reducing feature heights as normally required when utilizing copper to remain within the aspect ratio limits of pure copper and/or allow for improved extrusion at smaller feature heights not achievable utilizing copper alone. Thus, in embodiments, at least a portion of the features according to the present technology exhibit a feature height H of greater than or about 100 nm, such as greater than or about 200 nm, such as greater than or about 300 nm, such as greater than or about 400 nm, such as greater than or about 500 nm, such as greater than or about 600 nm, such as greater than or about 700 nm, such as greater than or about 800 nm, such as greater than or about 900 nm, such as greater than or about 1 μm, such as greater than or about 1.1 μm, such as greater than or about 1.2 μm, such as greater than or about 1.3 μm, such as greater than or about 1.4 μm, such as greater than or about 1.5 μm, or such as less than or about 5 μm, such as less than or about 2 μm, such as less than or about 1.5 μm, such as less than or about 1.4 μm, such as less than or about 1.3 μm, such as less than or about 1.2 μm, such as less than or about 1.3 μm, such as less than or about 1.2 μm, such as less than or about 1.1 μm, such as less than or about 1 μm, such as less than or about 900 nm, such as less than or about 800 nm, such as less than or about 700 nm, such as less than or about 600 nm, such as less than or about 500 nm, such as less than or about 400 nm, such as less than or about 300 nm, such as less than or about 200 nm, or any ranges or values therebetween.

Notwithstanding the features formed, in embodiments, method 300 may include providing a substrate 405, such as the substrate 405 depicted in FIG. 4A, at optional operation 305 to a polishing system 200 disposed in one or more process chambers, such as process chamber 114. The substrate 405 may include silicon oxide 410 defining one or more features 402 recessed from a surface of the silicon oxide 410, a liner 415 extending across the silicon oxide 410 and within the one or more features, and a copper-containing layer 420 deposited on the liner 415 and extending within the one or more features. In some embodiments, the liner 415 may be tantalum nitride, or any other suitable liner material incorporated to limit or prevent the potential for diffusion of metal into the dielectric material. As previously described, the silicon oxide 410, liner 415, and copper-containing layer 420 may be formed by any number of processing techniques that may be performed to develop a substrate and produce the structure described.

As will be described in greater detail below, during a polishing operation 310 in method 300, the overall removal rate of metal, such as the copper-containing layer 420, may be greater than the removal rate of dielectric material, such as the silicon oxide 410, if utilizing a metal-selective slurry. If using a dielectric-selective slurry, alone or in combination with a metal-selective slurry, a dielectric selective slurry may still cause an amount of removal of the metal, when exposed to the polishing pad and slurry. Nonetheless, the rate of removal in the copper-containing layer 420 may be greater towards the center of the copper in the one or more features as this copper may be a softer, bulk material. This greater rate of removal may result in a concave shape or dish shape forming in the copper during polishing. Too much dishing may be considered a defect in polishing processing for copper-to-copper hybrid bonding and/or heterogeneous integration applications. The concave shape or dish shape may feature a nadir or dish depth, respectively, that is the difference in height between the lowest point in the metal and the surface from which the feature is formed in the dielectric material, or a difference in edge height of the metal within the feature. If the nadir or dish depth is too great, the material may not be useful for certain end products.

For example, copper-to-copper hybrid bonding is one such application that may be sensitive to an imprecise nadir or dish depth. In some applications of copper-to-copper hybrid bonding, if the nadir or dish depth is too great, the copper-to-copper bond may not be sufficiently strong due to limited contact with studs from mating features, or the coupling may not occur at all. In these applications substrate 405 having copper-containing layers 420 may be contacted by a secondary substrate for mating during back end of line process, and prior to an annealing operation. The dielectric material of each substrate 405, such as the silicon oxide 410, may contact the dielectric material of the other substrate such that the two separate substrates may bond into one structure. During the annealing operation, the dielectric materials may form oxide-to-oxide covalent bonds. The copper-containing layer 420 of the mating substrate may also extrude to contact the copper-containing layer 420 of the substrate 405. If the nadir or dish depth is too great, the copper-containing layer 420 may be too far recessed to connect with the copper stud during the annealing operation to contact the other copper-containing layer. However, as may be understood, in embodiments, connection may still be made due to the improved extrusion heights of the copper-alloy of the present technology, even if a large dish depth is maintained. Still, in embodiments, polishing may include more than one polishing slurry or polishing step, as will be discussed in greater detail below, either prior to or subsequent application of the second metal in order to improve dish depth an extrusion height.

Figure 4B:
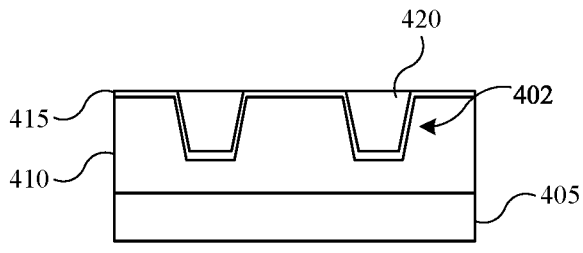

Nonetheless, after providing the substrate 405 to the polishing system 200, the substrate 405 may be contacted with one or more slurries at operation 310. As used throughout the disclosure, contact may be used interchangeably with polish, as contacting the substrate 405 with a slurry may result in a chemical operation that polishes the substrate 405. In some embodiments, at operation 310, the method 300 may include contacting the substrate 405 with a first platen in addition to the first slurry. Contacting the substrate 405 with the first slurry, and the first platen in some embodiments, may remove a first portion of the copper-containing layer 420. Operation 310 may remove the first portion of the copper-containing layer 420 to the plane of liner 415, which may fully separate the regions of copper across the substrate 405. Removing the first portion of the copper-containing layer 420 may isolate individual copper plugs within the copper-containing layer 420. The copper plugs may refer to the portions of the copper-containing layer 420 that extend into the one or more features. The first slurry, if more than one slurry is used, may be selective to copper, and removing the copper-containing layer 420 may not remove a substantial amount of the liner 415. Therefore, operation 310 may remove the copper-containing layer 420 such that the liner 415 may be at least partially exposed and that the copper-containing layer 420 may be recessed to expose the liner 415 across a surface of the substrate and/or in the one or more features of the silicon oxide 410, as shown in FIG. 4B.

In embodiments, after at least a first polishing operation 310, substrate 405 undergoes a cleaning operation at operation 315. In embodiments, the cleaning operation (also referred to as a pre-clean operation) is any cleaning process suitable for removing a metal oxide layer from substrate 405. For instance, in embodiments, a plasma assisted etch process, a reactive etch or clean process, the like, or a combination thereof may be conducted in order to remove any byproducts formed on the substrate, such as surface oxidation. In embodiments, a preclean operation 315 may be conducted via a Siconi™ etch process, or any reactive etch or clean process known in the art. For instance, such a pre-clean may be selected to remove copper oxides formed on an upper surface 412 of a substrate 405, as an example only. Nonetheless, in embodiments, a substrate 405 may be loaded into load lock 110,112 and transferred to a preclean chamber (such as process chamber 116) via robots 126, 128. Thus, the pre-clean process may be considered to be an in-situ clean process within process system 100. However, in embodiments, the transfer may be from a first process chamber (such as process chamber 114) to process chamber 116, instead of loading through load locks 110,112 if a prior operation is performed according to method embodiments.

Moreover, in embodiments, after a preclean process, the substrate 405 is transferred under vacuum, to a deposition chamber, such as a process chamber 118. Namely, oxide formation on the copper-containing layer can prevent diffusion of a second metal into the copper containing layer. Thus, in embodiments, transfer to a deposition chamber 118 under vacuum is necessary in order to prevent formation of further oxides after the pre-clean operation 315.

Figure 4C:
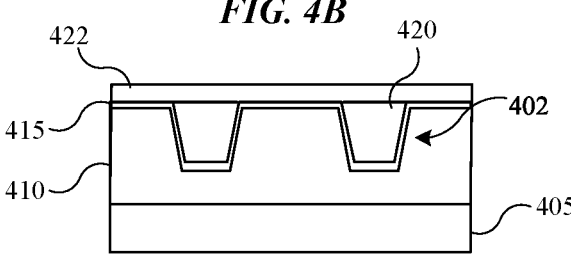

Nonetheless, in embodiments, a second metal is deposited over the substrate 405 containing the pre-formed copper-layer 420 to form second metal layer 422 as shown in FIG. 4C at operation 320. In embodiments, deposition can be according to any suitable method in the art, and may be conducted in a processing chamber configured as a chemical vapor deposition chamber, a physical vapor deposition chamber, an atomic layer deposition chamber, a thermally enhanced chemical vapor deposition chamber, a plasma-enhanced chemical vapor deposition chamber, an electroless deposition chamber, or a plasma enhanced atomic layer deposition chamber.

As illustrated, in embodiments, second metal layer 422 overlies substrate 405, liner 415, and copper-containing layer 420 in features 402. In embodiments, the second metal may be any metal suitable for diffusion with copper that has a coefficient of thermal expansion greater than pure copper. Thus, in embodiments, the second metal is any metal having a coefficient of thermal expansion of greater than or about 17, such as greater than or about 18, such as greater than or about 19, such as greater than or about 20, such as greater than or about 21, such as greater than or about 22, such as greater than or about 23, such as greater than or about 24, or any ranges or values therebetween. Nonetheless, in embodiments, the second metal may be a metal suitable for alloying with copper to produce a coefficient of thermal expansion of the alloy according to any one or more of the above values. In embodiments, such as second metal may be tin, aluminum, nickel, lead, zinc, an alloy thereof, or a combination thereof.

Figure 4D:
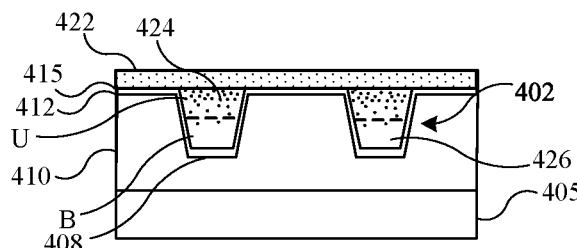

Regardless of the second metal selected, after forming the second metal layer 422 the substrate 405 is exposed to a thermal anneal or thermal diffusion process at operation 325. As illustrated in FIG. 4D, during the diffusion process, second metal particles 424 diffuse into copper-containing layer 420 to form a copper-metal alloy layer 426. As illustrated, in embodiments, the copper-alloy layer 426 has an upper portion U disposed adjacent to upper surface 412 of substrate 405 and a lower portion B adjacent to feature bottom 408. While the sections are shown divided by an imaginary dotted line at generally the midpoint of the height of the feature 402, it should be understood that there is no firm divider, and that the upper and lower portions may be divided anywhere along the height of the respective feature.

Nonetheless, in embodiments, the lower portion B may contain a greater percentage of copper in the copper-metal alloy 426 than upper portion U. For instance, in embodiments, lower portion B may contain at least about 90 wt. % copper based upon the weight of the copper alloy, such as greater than or about 91 wt. %, such as greater than or about 92 wt. %, such as greater than or about 93 wt. %, such as greater than or about 94 wt. %, such as greater than or about 95 wt. %, such as greater than or about 96 wt. %, such as greater than or about 97 wt. %, such as greater than or about 98 wt. %, such as greater than or about 99 wt. %, or even up to about 99.9 wt. % copper.

Moreover, in embodiments, the upper portion U may still contain a majority weight percentage of copper, but may contain less than or about 97 wt. % copper based upon the weight of the metal alloy layer, such as less than or about 95 wt. %, such as less than or about 94 wt. %, such as less than or about 93 wt. %, such as less than or about 92 wt. %, such as less than or about 91 wt. %, such as less than or about 90 wt. %, such as less than or about 87.5 wt. %, such as less than or about 85 wt. %, such as less than or about 82.5 wt. %, such as less than or about 80 wt. %, or any ranges or values therebetween.

Nonetheless, the present technology has surprisingly found that the conductivity of the copper layer may be maintained while increasing the coefficient of thermal expansion even when the total weight percentage of copper in the copper-metal alloy remains high. Thus, in embodiments, the copper-metal alloy layer 426 may contain at least about 85 wt. % copper based upon the weight of the copper alloy, such as greater than or about 86 wt. %, such as greater than or about 87 wt. %, such as greater than or about 88 wt. %, such as greater than or about 89 wt. %, such as greater than or about 90 wt. %, such as greater than or about 91 wt. %, such as greater than or about 92 wt. %, such as greater than or about 93 wt. %, such as greater than or about 94 wt. %, such as greater than or about 95 wt. %, such as greater than or about 96 wt. %, such as greater than or about 97 wt. %, or any values or ranges therebetween.

Even with small weight percentages of a second metal, the copper-metal alloy layer 426 may exhibit an increase in coefficient of thermal expansion such that the copper-metal alloy layer has a coefficient of thermal expansion that is at least about 20% greater than a coefficient of thermal expansion of pure copper, such as at least about 25%, such as at least about 30%, such as at least about 35%, such as at least about 40%, such as at least about 45%, such as at least about 50%, such as at least about 55%, such as at least about 60%, such as at least about 65%, such as at least about 70%, such as at least about 75%, such as at least about 80%, such as at least about 85%, such as at least about 90%, such as at least about 95%, such as even about 100% greater than a coefficient of thermal expansion of pure copper, or any ranges or values therebetween.

In addition, it was surprisingly found that even with relatively small weight percentages of the second metal, the increase in coefficient of thermal expansion is sufficient to enable good extrusion heights even at lower anneal temperatures. Thus, in embodiments, a post-bond anneal temperature, or another anneal process according to the present technology may be conducted at less than or about 350° C., such as less than or about 340° C., such as less than or about 330° C., such as less than or about 320° C., such as less than or about 310° C., such as less than or about 300° C., such as less than or about 290° C., such as less than or about 280° C., such as less than or about 270° C., such as less than or about 260° C., such as less than or about 250° C., or any ranges or values therebetween.

Even at lower temperatures, features 402 containing a copper-metal alloy 426 may exhibit an extrusion height (or the change in height of the copper-metal alloy after post-bond extrusion) that is at least about 2.5% greater than pure copper after post-bond annealing at less than or about 350° C., such as at least about 5%, such as at least about 7.5%, such as at least about 10%, such as at least about 12.5%, such as at least about 15%, such as at least about 20%, such as at least about 25%, such as at least about 30%, such as at least about 40%, such as at least about 50%, or any ranges or values therebetween. For instance, in embodiments as discussed above where hybrid or heterogenous bonding is desired, while not shown, a copper-metal alloy layer 426 may extrude towards or above upper surface 412 by greater than or about 1 nm after post-bond annealing at temperatures of less than or about 350° C., such as greater than or about 1.25 nm, such as greater than or about 1.5 nm, such as greater than or about 1.75 nm, such as greater than or about 2 nm, such as greater than or about 2.5 nm, such as greater than or about 3 nm, such as greater than or about 3.5 nm, such as greater than or about 4 nm, or any ranges or values therebetween.

Moreover, due at least in part to the capability of utilizing lower post-bond annealing temperatures, the substrate 405 may include one or more organic films. Namely, as noted above, in conventional systems, post-bond anneal temperatures necessary for extruding copper features would denature or destroy organic films. Thus, in embodiments, the substrate 405 includes one or more organic films which may form liner 415 or be in addition to liner 415. In embodiments, the organic film can include adhesives, including temporary adhesives, polyimide based organic films, or other organic films as known in the art.

After formation of copper-metal alloy layer 426, the substrate 405 may be subjected to a second polishing operation 330. The polishing operation may include at least a first slurry or first polishing step that is generally identical to that of operation 310. Thus, in embodiments, substrate 405 may be transferred back to polishing process chamber 114, or to a second polishing chamber. In embodiments, the first slurry may mainly remove the copper-metal alloy layer 426 without removing liner 415. Such an embodiment may look generally like FIG. 4B with copper-containing layer 420 replaced with copper-metal alloy layer 426.

Figure 4E:
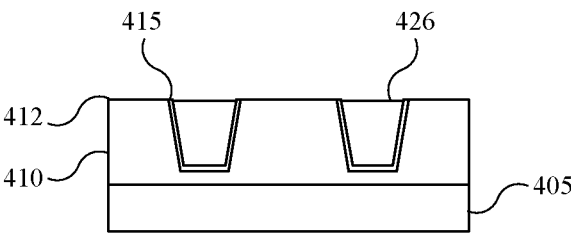

Nonetheless, in embodiments, the substrate 405 may be contacted with a second slurry during operation 330. In some embodiments, at operation 330, the method 300 may include contacting the substrate 405 with a second platen in addition to the second slurry. The second slurry, and the second platen in some embodiments, may remove at least a portion of the liner 415 as illustrated in FIG. 4E. The second slurry may be selective to removing the liner 415 and may not remove a substantial amount of the copper-metal alloy layer 426. The second slurry may be selective to oxide and nitride materials, and may remove the liner and/or the oxide material at a rate that is greater than or about 1.5:1 compared to copper, and may be greater than or about 1.6:1, greater than or about 1.7:1, greater than or about 1.8:1, greater than or about 1.9:1, greater than or about 2.0:1, greater than or about 2.1:1, greater than or about 2.2:1, greater than or about 2.3:1, greater than or about 2.4:1, greater than or about 2.5:1, greater than or about 2.6:1, greater than or about 2.7:1, greater than or about 2.8:1, greater than or about 2.9:1, greater than or about 3.0:1, or more. The second slurry may remove the portion of the liner 415 that may be exposed after operation 310. That is, the portion of the liner 415 between the silicon oxide 410 and the first portion of the copper-containing layer 420, remaining after the first slurry (e.g. portion of 415 similar to that of FIG. 4B) may be removed during one or more slurry treatments of operation 330. As the portion of the liner 415 may be removed, the copper-metal alloy layer 426 may protrude above the silicon oxide 410 based on the selectivity of removal or may be generally coplanar with upper surface 412, as shown in FIG. 4E.

In embodiments where it is desired to still control dish depth, after the substrate 405 is contacted with the second slurry, the substrate 405 may be optionally contacted with a third slurry at operation 330. In some embodiments, at operation 330, the method 300 may include contacting the substrate 405 with a third platen in addition to the third slurry. The third slurry, and the third platen in some embodiments, may remove at least a second portion of the copper-metal alloy layer 426. The third slurry may be selective to removing the copper-metal alloy layer 426 and may not remove a substantial amount of the silicon oxide 410. The third slurry may remove the second portion of the copper-metal alloy layer 426 that may be extend above upper surface 412 after contact with the second slurry. That is, the copper-metal alloy layer 426 protruding above silicon oxide 410 may be removed using a third slurry such that the copper-metal alloy layer 426 may be recessed below the silicon oxide 410. The third slurry may be operated at a higher pressure than the first and/or second slurry. This higher pressure may result in faster removal of softer, bulk copper-metal alloy in the middle of the one or more features of the substrate 405. This faster removal may result in dishing occurring in the copper-metal alloy layer 426. In some embodiments, the third slurry may be the same as the first slurry. Additionally or alternatively, the third platen may be the same as the first platen.

During contacting of the substrate 405 with the third slurry, the copper-metal alloy material 426 may be purposefully recessed below the silicon oxide 410. Purposefully recessing, or dishing, the copper-metal alloy material 426 below suitable levels for copper-to-copper hybrid bonding may allow for a longer duration of a fourth slurry operation, discussed below in greater detail, which may be preferred such that greater control may be exerted over the duration of the fourth slurry operation. For example, if the copper-metal alloy material 426 is only slightly recessed below the silicon oxide 410, the duration of the forth slurry operation may be so short that greater dishing of the copper-metal alloy material 426 than desirable may inadvertently occur, which may cause uniformity issues, or over etching of the materials. If the copper-metal alloy material 426 is over-recessed below the silicon oxide 410, the fourth slurry operation may take longer and may be a slower process, which may allow the final nadir or dish depth to be controlled to a finer degree.

After the third slurry, if utilized, the copper-metal alloy material 426 may be characterized by a concave profile within the one or more features 402 in the silicon oxide 410. The copper-metal alloy material 426 may additionally or alternatively be characterized by a dish profile having a dish depth. A nadir of the concave profile, or a dish depth of the dish profile, after a third slurry operation may be greater than or about 5 nm within a surface of the silicon oxide 410, and may be greater than or about 6 nm, greater than or about 7 nm, greater than or about 8 nm, greater than or about 9 nm, greater than or about 10 nm, greater than or about 6 nm, greater than or about 11 nm, greater than or about 12 nm, greater than or about 13 nm, greater than or about 14 nm, greater than or about 15 nm, or higher.

A nadir or dish depth of greater than 5 nm may be too large for copper-to-copper hybrid bonding, for example. When the nadir or dish depth is greater than or about 5 nm or higher, subsequent annealing to bond the separate copper elements may not be effective as the copper may be too far apart. During annealing, the separate copper elements may extrude towards each other, but if the nadir or dish depth is too greater, the copper elements will not bond to each other. If the nadir or dish depth is too little, such that the copper protrudes from one or both of the substrates 405, the dielectric materials of the substrates 405 will not be able to bond to one another sufficiently. Further, temperature during annealing may be limited by other components on the substrate 405, such as gallium nitride, which may have a thermal limit of about 400° C. This thermal limit may prevent the annealing from occurring at a much higher temperature than of about 400° C. As noted above, by performing the coupling at lower temperatures, the amount of thermal expansion may also be reduced, which may further limit copper expansion and coupling between the copper materials. Therefore, additional processing to fine-tune the nadir or dish depth of the copper-containing layer 420 may be necessary such that a copper-to-copper bond may form when separate copper elements of two substrates 405 are contacted. However, as noted above, in embodiments, the copper-metal alloy material 426 may exhibit greatly improved extrusion such that further processing or control of dish depth is not necessary.

Nonetheless, if utilized, during an optional fourth slurry operation, the substrate 405 may be contacted with a fourth slurry. In some embodiments, the method 300 may include optionally contacting the substrate 405 with a fourth platen in addition to the fourth slurry. The fourth slurry, and the fourth platen in some embodiments, may remove at least a second portion of the silicon oxide 410. In some embodiments, the fourth slurry may be selective to removing the silicon oxide 410 and may not remove a substantial amount of the copper-metal alloy material 426. Contacting the substrate 405 with the fourth slurry and the fourth platen may further remove a third portion of the copper-metal alloy material 426. At a fourth slurry operation, the copper-metal alloy material 426 may be recessed such that the fourth slurry and the fourth platen may not immediately remove the copper-metal alloy material 426. Instead, the fourth slurry and the fourth platen may remove only the silicon oxide 410 until the silicon oxide 410 is removed to a level near the copper-metal alloy material 426. Once the silicon oxide 410 is removed to a level near the copper-metal alloy material 426, the fourth slurry and the fourth platen may also remove the copper-metal alloy material 426. The fourth slurry and the fourth platen may begin removing the copper-metal alloy material 426 when the silicon oxide 410 is less than or about 2 nm higher than the copper-metal alloy material 426, such as less than or about 1 nm. The fourth slurry may remove the silicon oxide 410 that may be extending above the copper-metal alloy material 426 after operation 320. That is, the silicon oxide 410 above copper-metal alloy material 426 may be removed during operation 325 such that the copper-metal alloy material 426 may be recessed below the silicon oxide 410 in a lesser amount than after the third slurry. In some embodiments, the fourth slurry may be the same as the second slurry. Additionally or alternatively, the fourth platen may be the same as the second platen. However, as discussed above, in embodiments, due to the improvement in coefficient of thermal expansion and extrusion height, no fourth slurry may be necessary, as the copper-metal alloy material 426 extends substantially to the upper surface 412 and/or exhibits improved extrusion heights so as to remove the need for lower dish depth.

A nadir or dish depth of less than 5 nm may be small enough for copper-to-copper hybrid bonding, for example. When the nadir or dish depth is less than 5 nm or lower, subsequent annealing to bond the separate copper elements may be effective as the copper may be close enough to bond to each other during the annealing step. During the annealing step, the copper elements from separate substrates may extrude towards one another, may contact each other, and may bond.

Nonetheless, it should be understood that, in embodiments, the nadir depth may be outside of the ranges discussed above due to the formation of one or more copper alloys. Thus, it should be understood that, in embodiments, any polishing method may be utilized, as the method of preparing a copper-containing layer and the resulting structure have improved extrusion during annealing and/or may have improved extrusion at lower temperatures.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a metal" includes a plurality of such metals, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing method comprising:
cleaning a substrate, wherein the substrate comprises:
    silicon oxide defining one or more features,
    a liner extending across the silicon oxide and within the one or more features, and
    a copper-containing layer deposited on the liner and extending within the one or more features;
depositing a second metal over the substrate, wherein the second metal has a coefficient of thermal expansion of greater than or about 17;
diffusing the second metal into the copper-containing layer; and
annealing the second metal into the copper-containing layer at a temperature of less than 350° C. to form a copper-alloy.

2. The method of claim 1, wherein the copper-containing layer is deposited in one or more features comprising a height to width aspect ratio of greater than or about 6:1.

3. The method of claim 1, wherein the substrate further comprises an organic film.

4. The method of claim 1, wherein the copper-alloy extrudes greater than or about 1 nm at the annealing temperature of less than 350° C.

5. The method of claim 1, further comprising an anneal process at a temperature of less than or about 330° C.

6. The method of claim 1, wherein the copper-alloy has a coefficient of thermal expansion that is at least about 20% greater than a coefficient of thermal expansion of copper.

7. The method of claim 6, wherein the coefficient of thermal expansion of the copper-alloy is at least about 40% greater than the coefficient of thermal expansion of copper.

8. The method of claim 1, wherein the second metal is tin, aluminum, nickel, lead, zinc, or a combination thereof.

9. The method of claim 1, further comprising polishing the substrate after forming the copper-alloy.

10. The method of claim 1, wherein the cleaning includes a deoxidation treatment.

11. The method of claim 10, wherein the cleaning is an in-situ module.

12. The method of claim 11, wherein the method includes transferring the substrate under vacuum from the in-situ cleaning module to a deposition chamber configured to deposit the second metal.

13. The method of claim 12, wherein the deposition chamber is a chemical vapor deposition chamber, a physical vapor deposition chamber, an atomic layer deposition chamber, a thermally enhanced chemical vapor deposition chamber, a plasma-enhanced chemical vapor deposition chamber, an electroless deposition chamber, or a plasma enhanced atomic layer deposition chamber.

14. A semiconductor processing method comprising:

etching one or more features having a first side, a second side, a bottom, and a height to width aspect ratio of greater than or about 6:1 in a substrate, wherein the substrate comprises silicon oxide;

forming a liner extending across the silicon oxide and within the one or more features, and depositing a copper-containing layer on the liner and extending within the one or more features;

deoxidizing the copper-containing layer;

depositing a second metal over the copper-containing layer, wherein the second metal has a coefficient of thermal expansion of greater than or about 17; and annealing the second metal into the copper-containing layer at an annealing temperature of less than 350° C. to form a copper-alloy.

15. The method of claim 14, wherein the copper-alloy extrudes greater than or about 1 nm at the annealing temperature of less than 350° C.

\* \* \* \* \*